(12) United States Patent
Chen et al.

(10) Patent No.: US 6,574,134 B1
(45) Date of Patent: Jun. 3, 2003

(54) NON-VOLATILE FERROELECTRIC CAPACITOR MEMORY CIRCUIT HAVING NONDESTRUCTIVE READ CAPABILITY

(75) Inventors: Shue-Shuen Chen, Yunlin Hsien (TW); Hsiang-Lan Lung, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/050,153

(22) Filed: Jan. 18, 2002

(51) Int. Cl.[7] .............................................. G11C 11/22
(52) U.S. Cl. ........................ 365/145; 365/149; 257/295
(58) Field of Search ................................ 365/117, 145, 365/149; 257/295, 296

(56) References Cited

U.S. PATENT DOCUMENTS 4,914,627 A * 4/1990 Eaton et al. ................ 365/117
6,288,931 B1 * 9/2001 Kye et al. .................... 365/145
6,362,500 B2 * 3/2002 Ishiwara ...................... 257/295

* cited by examiner

*Primary Examiner*—Son Mai

(57) ABSTRACT

A non-destructive ferroelectric capacitor-based memory circuit has a plurality of word lines located in parallel to each other. A plurality of bit lines is located across the word lines and a plurality of memory cells is located at intersections between the word lines and the bit lines. Each of the memory cells further has a MOS transistor and two ferroelectric capacitors coupled together in series to have a common node to couple with the transistor, and two plate lines coupled with two non-common nodes of the two series ferroelectric capacitors, respectively.

4 Claims, 5 Drawing Sheets

NON-VOLATILE FERROELECTRIC CAPACITOR MEMORY CIRCUIT HAVING NONDESTRUCTIVE READ CAPABILITY

FIELD OF THE INVENTION

The present invention relates to a non-volatile ferroelectric capacitor-based memory circuit, and more particularly related to a non-destructive ferroelectric capacitor-based memory circuit method.

BACKGROUND OF THE INVENTION

Integrated circuit memory devices containing ferroelectric memory cells therein typically contain ferroelectric capacitors to store data. As will be understood by those skilled in the art, ferroelectric capacitors typically comprise a pair of electrodes with a layer of ferroelectric material therebetween having hysteresis characteristics. The ferroelectric material can typically be polarized in a first or a second opposite polarization state and this state is nonvolatile inasmuch as the application of a zero potential bias across the pair of electrodes will not result in a change or elimination of the state. The first and second polarization states can be utilized to reflect the storage of logic 0 and logic 1 data signals, respectively.

FIG. 1 illustrates a hysteresis curve of ferroelectrical material, wherein the abscissa represents the field voltage applied to the material and the ordinate represents the polarization of the material. If a capacitor is formed using a ferroelectric material between its plates, because of the hysteresis curve, the flow of current through the capacitor will depend on the prior history of the voltages applied to the device. If a ferroelectric capacitor is in an initial state on which a zero volt charge is applied, point A or point D may indicate polarization. Assuming that point A in FIG. 1 indicates polarization, a positive voltage which is greater than the coercive voltage (referring to point B in FIG. 1) is applied across the capacitor. The capacitor will then conduct current and have a new polarization state (referring to point C in FIG. 1). When the applied voltage is removed, the ferroelectric capacitor will maintain the same polarization state as shown at point D instead of returning to the state as shown at point A. A positive voltage continuously applied across the capacitor will cause a little change in the polarization. However, enough negative voltage will cause the polarization to vary from point D to point E as indicated in FIG. 1. Once the negative voltage is removed from the capacitor, the ferroelectric capacitor will maintain the same polarization state and the curve moves to point A. Therefore, point A and point D respectively represent two different logical states when zero volt is applied across the capacitor.

Conventional ferroelectric memory circuits include a plate line, a bit line, and a number of memory cells comprising a capacitor and a transistor connected between the plate line and the bit line. A particular memory cell is accessed by driving one of the transistors with a selected word line signal, and then driving the plate line with a pulse, generally of the supply voltage magnitude. If one polarization state is stored in the capacitor, then an electrical charge of nominal magnitude is transferred from the capacitor to the bit line. On the other hand, if the ferroelectric capacitor is initially stored the other polarization state, a substantially larger electrical charge is transferred to the bit line. Sense amplifier circuits are utilized to sense the bit line voltage, and thus the amount of charge transferred thereto during the read operation, and thereby determine the polarization state initially stored in the ferroelectric capacitor. The smaller amount of charge transferred from the ferroelectric capacitor during the read operation to the bit line does not involve a change in the polarization state of the capacitor itself. Hence, the reading of the ferroelectric capacitor in this state is nondestructive. However, when the read operation of a ferroelectric capacitor is accompanied by the substantially larger transfer of electrical charge to the bit line, the ferroelectric capacitor changes state from one polarization polarity to the other.

In order to circumvent this polarization change, the conventional memory circuits normally include a restore cycle for restoring the original polarization state due to the destructive readout. Although ferroelectric memory devices are characterized as being nonvolatile, and the destructive read operations can be corrected by a restoration operation, such devices are yet susceptible to problems which cannot be corrected. For example, should the power fail or be removed from a conventional ferroelectric memory device during an ongoing read operation in which the polarization states change, the ferroelectric capacitor may be in the incorrect state when power is again applied to the memory, thereby storing corrupted data. On the other hand, in those memory read operations which result in the changing or reversal of ferroelectric capacitor polarization states, the capacitors themselves undergo a phenomenon termed "fatigue", which reduces the life of the capacitor. As a result of fatigue, the reliability and life of a ferroelectric capacitor is proportional to the number of times it has been read and/or written. Therefore, the reliability and life of a ferroelectric capacitor would be increased if ferroelectric capacitors could be read without reversal of the polarization states.

From the foregoing, it can be seen that a need exists for a method and circuits adapted for reading ferroelectric capacitors such that the polarization states are not destroyed or switched to the other state. A related need exists for a ferroelectric memory cell structure which can be read and which does not require a subsequent restore operation. Another need exists for a ferroelectric memory cell which can be read and which does not substantially affect the life of the capacitor due to fatigue.

SUMMARY OF THE INVENTION

The read operation cycle of a conventional ferroelectric capacitor memory circuit often involves a destructive read because the ferroelectric capacitor changes state from one polarization state to the other. In order to maintain the original data (original polarization state), the conventional memory circuit needs a restore cycle for restoring the original data. The time required for restoring data will reduce the operation speed. Those reading operation cycles which include the destructive read and restoring cycle may also result in the ferroelectric material "fatigue", which reduces the life and reliability of the ferroelectric capacitor. As a result of the "fatigue", the reliability and life of a ferroelectric capacitor is proportional to the number of times it has been read and written. On the other hand, if the power fails during the restoring operation period, the stored data is destroyed.

The main purpose of the present invention is to provide a kind of ferroelectric capacitor-based memory circuit which can be read and does not require a subsequent restore operation.

The other purpose of the present invention is to provide a kind of operation method of the ferroelectric capacitor-based memory circuit memory in which the polarization states are not destroyed or switched to the other state.

The another purpose of the present invention is to provide a ferroelectric memory cell which can be read, in which the life of the capacitor is not substantially affected by fatigue.

In accordance with the foregoing purpose, the present invention is related to a ferroelectric capacitor-based memory circuit and operation method. The present invention comprises a plurality of word lines, a plurality of bit lines and a number of memory cells comprising two ferroelectric capacitors and a transistor. The two ferroelectric capacitors are coupled in series to form a common node between the two ferroelectric capacitors, with two poles each corresponding uniquely to only one respective ferroelectric capacitor. The two plate lines are coupled to the poles respectively. Because the ferroelectric capacitor will exhibit different capacitance according to the polarization, the polarization states of the two ferroelectric capacitors are set corresponding to the data to be stored. One of the plate lines is grounded while a voltage less than the coercive voltage is applied to the other plate line. Then the data stored in the memory can be read out by sensing whether the voltage at the common node is above or below the midpoint voltage.

According to the present invention, the disclosed ferroelectric capacitor-based memory circuit and operation method are adapted for reading a ferroelectric capacitor such that the polarization states are not destroyed or switched to the other state and a subsequent restore operation is not required. Hence, the life or reliability of the capacitor is not affected by to fatigue resulting from the switch of polarization states. The present invention also discloses a simple method for writing the polarization states of a memory cell.

BRIEF DESCRIPTION OF THE DRAWINGS

The foregoing aspects and many of the attendant advantages of this invention will become more readily appreciated as the same becomes better understood by reference to the following detailed description taken in conjunction with the accompanying drawings, wherein.

DETAILED DESCRIPTION OF THE PREFERRED EMBODIMENTS

Without limiting the spirit and scope of the present invention, the method proposed in the present invention is illustrated with one preferred embodiment of the ferroelectric capacitor-based memory circuit. Skill artisans, upon acknowledging the embodiments, can apply the present invention to any kind of ferroelectric capacitor memory cell to increase the reliability and reading speed.

The read operation cycle of a conventional ferroelectric capacitor memory circuit often involves a destructive read because the ferroelectric capacitor changes state from one polarization state to the other. In order to maintain the original data (original polarization state), the conventional memory circuit needs a restore cycle for restoring the original data. The time required for restoring data may reduce the operation speed. Those reading operation cycles which include the destructive read and restoring cycle may result in the ferroelectric material "fatigue", which-reduces the life of the capacitor. As a result of the "fatigue", the reliability and life of a ferroelectric capacitor is proportional to the number of times it has been read and written. If the power fails during the restoring operation period, the stored data is destroyed. However, by using the present invention, the foregoing problems may be resolved.

Figure 2:
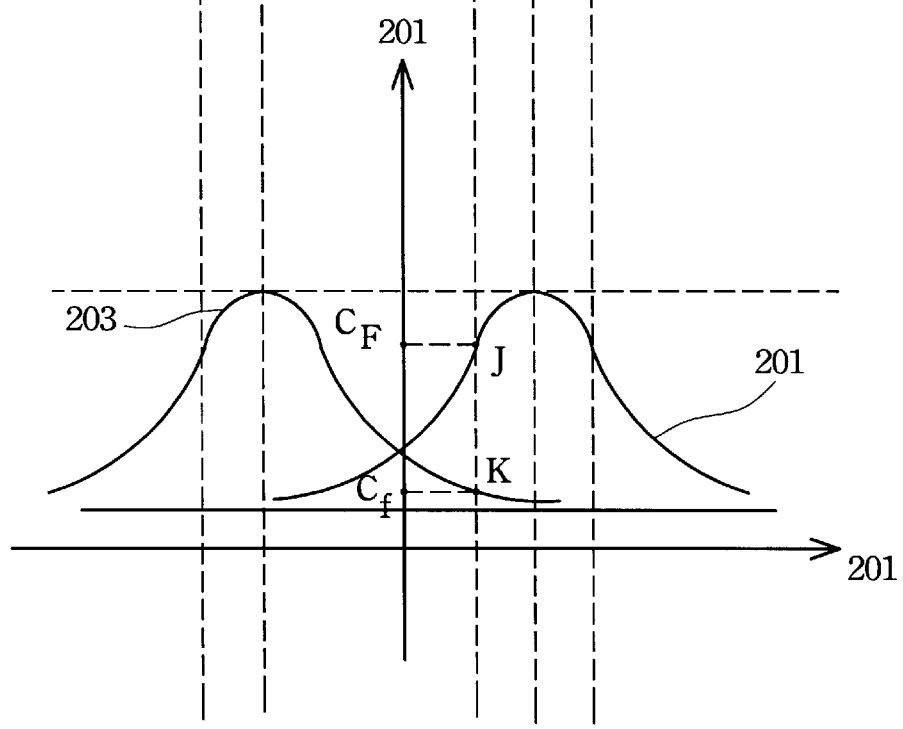
FIG. 2 depicts a capacitance with voltage curve according to the hysteresis curve of a conventional ferroelectric capacitor.

FIG. 2 illustrates a capacitance Vs. voltage curve according to the hysteresis curve of a ferroelectric capacitor. Capacitance vs. voltage curve 201 can be drawn according to the hysteresis curve 101 from point E to point C, wherein point J on the curve 201 refers to point I on the hysteresis curve 101. Capacitance vs. voltage curve 203 can be drawn according to the hysteresis curve 103 from point C to point E, wherein point K on the curve 203 refers to point H on the hysteresis curve 103. It is assumed that the different polarization states have been arranged for the two different ferroelectric capacitors; even though the same voltage is applied to the two ferroelectric capacitors respectively, the capacitances of the two ferroelectric capacitors are different. For example, if the first ferroelectric capacitor is polarized at point H and a positive voltage V is applied to it, the capacitance of the ferroelectric capacitor will be $C_f$ according to K point on the curve 203. On the other hand, if the second ferroelectric capacitor is polarized at point I and a positive voltage V is applied to it, the capacitance of the ferroelectric capacitor will be $C_F$ according to J point on the curve 201.

Figure 3:
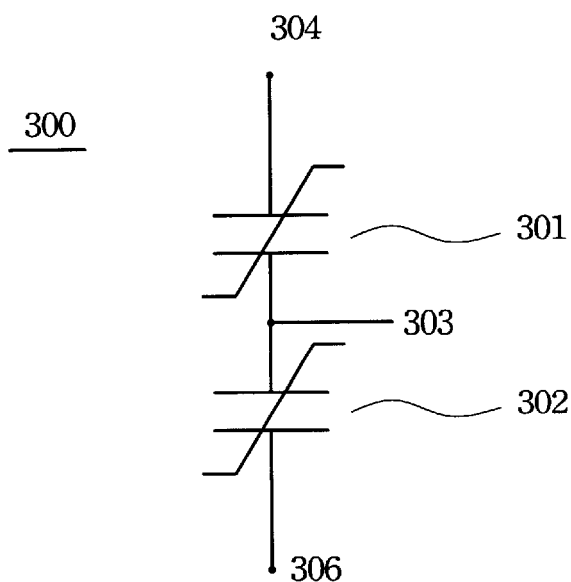
FIG. 3 depicts a pair of conventional ferroelectric capacitors in series.

FIG. 3 schematically illustrates a divider 300 formed by two ferroelectric capacitors 301 and 302 connected in series. This arrangement has a common node 303 between ferroelectric capacitors 301 and 302 and terminals 304 and 306 each corresponding uniquely to only one respective capacitor. If a voltage Vr is applied to terminals 304 and 306, the output voltage value Vg at common node 303 is described by the following equation:

$$Vg = Vr \times [C_{301}/(C_{302}+C_{301})]$$

wherein $C_{302}$ represents the capacitance of ferroelectric capacitor 302, and $C_{301}$ represents the capacitance of ferroelectric capacitor 301. The ferroelectric capacitors 301 and 302 exhibit different capacitances in different polarization states. Therefore, the output voltage value Vg of common node 303 may be determined by setting the polarization states of capacitors 301 and 302. It is assumed that the polarization states of ferroelectric capacitors 301 and 302 have been arranged as a special polarization state according to the preferred invention. Hence, the polarization state, or storage data, of a ferroelectric capacitor can be determined by sensing the output voltage value Vg.

Figure 4:
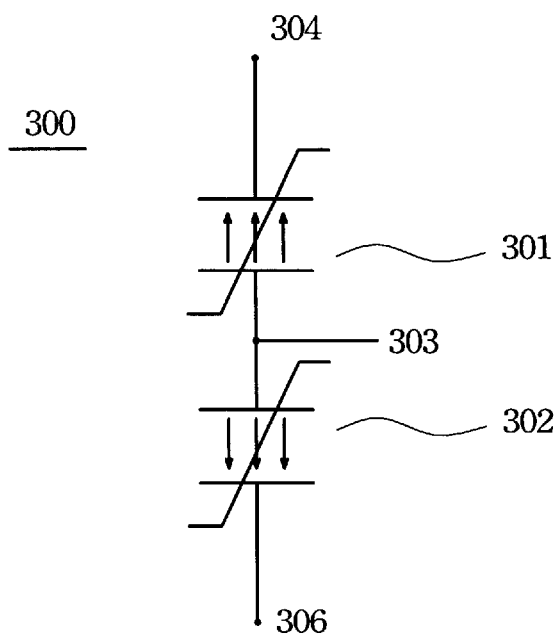
FIG. 4A depicts a kind of polarization state of conventional ferroelectric capacitors when applying a first voltage.
FIG. 4B depicts another kind of polarization state of conventional ferroelectric capacitors when applying a second voltage.
Figure 4:
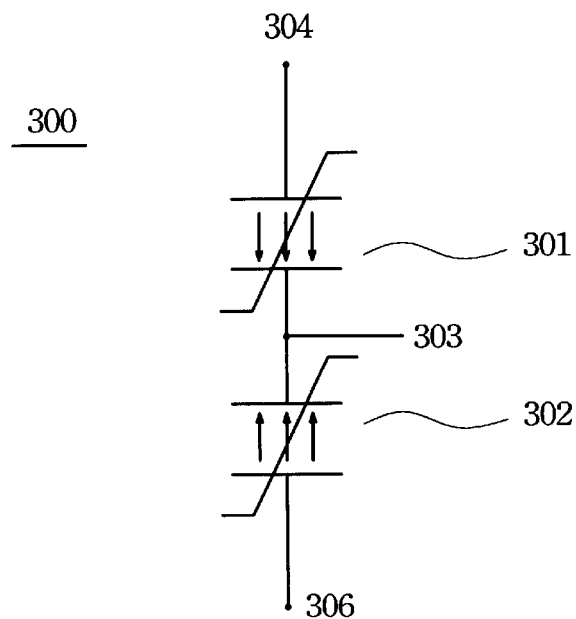

The polarization of this arrangement will now be considered, referring more particularly to FIG. 4A. If terminals 304 and 306 are both tied to zero volts and +5 volts is applied to common node 303, then the ferroelectric material in capacitors 301 and 302 will be polarized in the directions shown in FIG. 4A. Assuming the polarization direction is from high voltage to low voltage, the arrows indicate that the polarization direction is from common node 303 to terminals 304 and 306 respectively. At this time, if the applied voltage is removed from the common node 303, the polarization states of the two ferroelectric capacitors will be different. Assuming the polarization in a "down" direction is polarized in point "A" in FIG. 1 and the polarization in a "up" direction is polarized in point "D" in FIG. 1, the polarization state of ferroelectric capacitor 302 is polarized in point "A" in FIG. 1 and the polarization state of ferroelectric capacitor 301 is polarized in point "D" in FIG. 1. In this respect, the two ferroelectric capacitors store logic "0" digital data. On the other hand, another logic state "1" can be obtained by changing the voltages. Terminals 304 and 306 are both tied to +5 volts and zero volts are applied to common node 303. The ferroelectric material in capacitors 301 and 302 will be polarized in the direction as shown in FIG. 4B. The arrows indicate the polarization direction is from the terminals 304 and 306, respectively, to the common node 303. At this time, if removing the applied voltage from the terminals 304 and 306, the polarization states of the ferroelectric capacitor 302 is polarized at point "D" in FIG. 1, and the polarization state of ferroelectric capacitor 301 is polarized at point "A" in FIG. 1.

Figure 1:
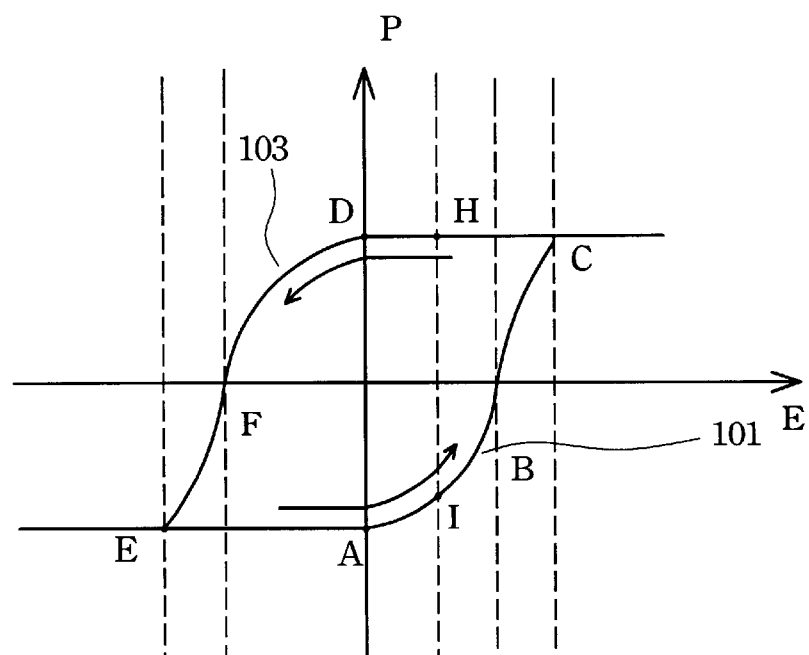
FIG. 1 depicts a hysteresis curve of a conventional ferroelectric capacitor.

If the polarization has been arranged as depicted in FIG. 4A, such that the polarization state of the ferroelectric capacitor 302 is polarized at point "A" in FIG. 1 and the polarization state of ferroelectric capacitor 301 is polarized at point "D" in FIG. 1, and if a $V_r$ voltage less than the coercive voltage is applied across the terminals 304 and 306, the polarization state of ferroelectric capacitor 302 will transfer from point "A" to point "I" to exhibit the capacitance $C_F$, and the polarization state of ferroelectric capacitor 301 will transfer from point "D" to point "H" to exhibit the capacitance $C_f$. Then a voltage will be develop at common node 303:

$$V_{g1}=V_r \times [C_f/(C_f+C_F)]$$

On the other hand, if the polarization has been arranged as depicted in FIG. 4B such that the polarization state of the ferroelectric capacitor 302 is polarized at point "D" in FIG. 1 and the polarization state of ferroelectric capacitor 301 is polarized at point "A" in FIG. 1, and if a $V_r$ voltage less than the coercive voltage is applied across the terminals 304 and 306, the polarization state of ferroelectric capacitor 302 will transfer from point "D" to point "H" to exhibit the capacitance $C_f$, and the polarization state of ferroelectric capacitor 301 will transfer from point "A" to point "I" to exhibit the capacitance $C_F$. Then a voltage will be develop at common node 303:

$$V_{g0}=V_r*[C_F/(C_f+C_F)]$$

Obviously, the output voltage $V_{g1}$ is greater than $V_{g0}$; therefore, the storage data of the two ferroelectric capacitors 301 and 302 can be determined by sensing the common node voltage. For example, if the sensed voltage is $V_{g0}$, then the storage data is logic "0". On the other hand, if the sensed voltage is $V_{g1}$, then the storage data is logic "1". According to the present invention, the disclosed ferroelectric capacitor circuit and operation method are adapted for reading a ferroelectric capacitor such that the polarization states are not destroyed or switched to the other state. Hence, the life or reliability of the capacitor is not affected by fatigue resulting from the switch of polarization states. The difference of the capacitance between the two ferroelectric capacitors may increase when the voltage, not greater than the coercive voltage, applied to the capacitor increases. At the time, the present invention may also reduce the effect of the leakage current and noise of the ferroelectric capacitor because the present invention reads the data by sensing the output voltage, unlike the conventional destructive read. The other aspect of the present invention is that the window value between the two ferroelectric capacitors and sensing output voltage variation may increase when the voltage not greater than the coercive voltage applied to them increases, which makes it easier to recognize the change of output voltage.

Figure 5:
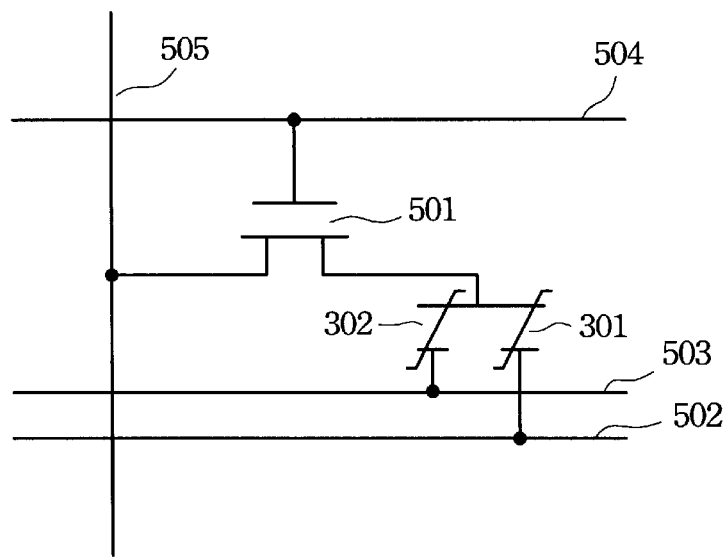
FIG. 5A depicts a ferroelectric capacitor-based memory circuit according to a first preferred embodiment of the present invention.
FIG. 5B depicts a part of ferroelectric capacitor-based memory circuit according to the first preferred embodiment of the present invention.
Figure 5A:
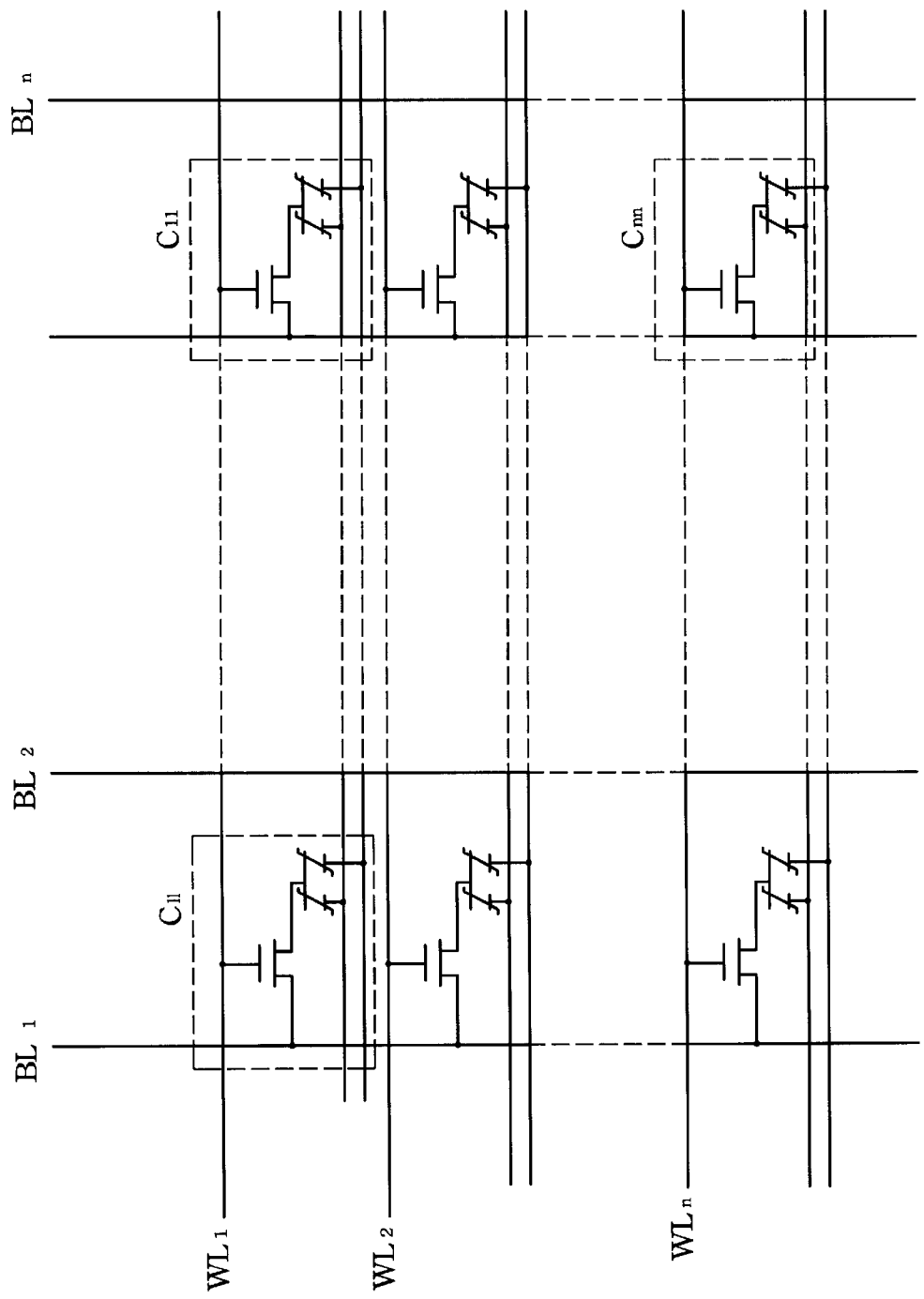

FIG. 5A depicts a first preferred embodiment of the invention in which a preferred ferroelectric capacitor-based memory circuit having ferroelectric capacitors comprises a plurality of word lines $WL_1$–$WLn$ located in parallel to each other, a plurality of bit lines $BL_1$–$BLn$ across the word lines and a plurality of memory cells $C_{11}$–$C_{nn}$ of the present invention located at intersections between the word lines and the bit line. When reading, the row address is determined by electing a word line and the column address is determined by selecting a bit line. FIG. 5B shows an enlarged picture of a ferroelectric capacitor memory cell $C_{11}$. A ferroelectric memory cell $C_{11}$ comprises a MOS transistor 501 and a capacitor divider 300, wherein the capacitor divider 300 is formed by two ferroelectric capacitors 301 and 302 in series and the arrangement has a common node between the two capacitors. The common node of the two ferroelectric capacitors is coupled to the MOS transistor 501 source/drain electrode. The other terminal of the ferroelectric capacitor 301 is coupled to a plate line 502, and the other terminal of the ferroelectric capacitor 302 is coupled to a plate line 503. The gate electrode of MOS transistor 501 is coupled to word line 504, and the other source/drain electrode is coupled to bit line 505.

When reading storage data, such as logic "0", a signal having a high voltage is supplied to a selected word line 504 connected to a gate electrode of MOS transistor 501. Next, a voltage, about 1 volt and less than the coercive voltage is applied across the plate lines 502 and 503. For example, 1 volt is applied to plate line 503 and the plate line 502 is grounded. Then the data stored in the memory cell can be read out by sensing the voltage at the bit line developed by the ferroelectric capacitor divider 300. The writing method according to the present invention may result in the ferroelectric capacitors 301 and 302 of the capacitor divider 300 having opposite polarization states. At this time, a voltage less than the coercive applied to the capacitor divider 300 will result in the two ferroelectric capacitors exhibiting two kinds of capacitance, the first and the second capacitance. If the ferroelectric capacitor 301 exhibits the first capacitance, such as the $C_f$ in FIG. 2, then the ferroelectric capacitor 302 will exhibit the second capacitance, such as the $C_F$ in FIG. 2. Conversely, if the ferroelectric capacitor 301 exhibits the second capacitance, such as the $C_F$ in FIG. 2, then the ferroelectric capacitor 302 will exhibit the first capacitance, such as the $C_f$ in FIG. 2. Therefore, the voltage at the bit line 505 developed by the ferroelectric capacitor divider 300 will exhibit a different voltage value. The storage data may be determined by sensing the bit line 505 voltage.

Figure 6:
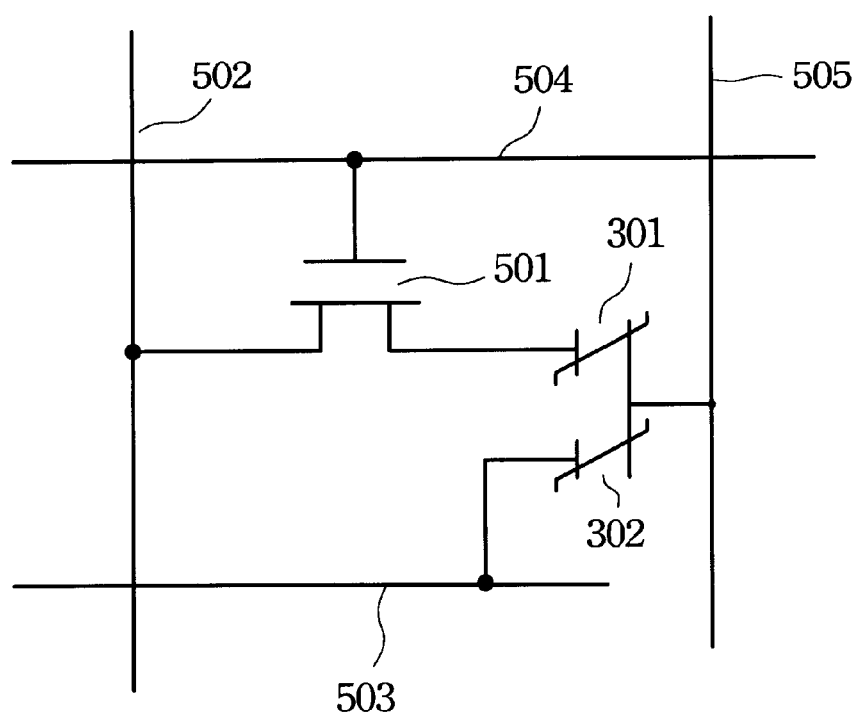
FIG. 6 depicts the ferroelectric capacitor-based memory circuit according to a second preferred embodiment of the present invention.

FIG. 6 depicts the ferroelectric capacitor-based memory circuit according to a second preferred embodiment of the present invention. The main point of difference is that the common node of the two ferroelectric capacitors is directly coupled to the bit line 505. The other terminal, not the common node, of the ferroelectric capacitor 301 is coupled via the MOS transistor 501 to the plate line 502. The second preferred embodiment has the same reading method as the first embodiment. First, a signal having a high voltage is supplied to a selected word line 504 connected to a gate electrode of MOS transistor 501. Next, a voltage, about 1 volt, less than the coercive voltage, is applied across the plate lines 502 and 503. For example, 1 volt is applied to plate line 503 while plate line 502 is grounded. Then the data stored in the memory cell can be read out by sensing the voltage at the bit line developed by the ferroelectric capacitor divider 300.

When writing logic data, a signal having a high voltage is supplied to a selected word line 504 connected to a gate electrode of MOS transistor 501. Next, a high voltage, about 5 volts, is applied to the bit line 505 and the plate lines 502 and 503 are both tied to zero volts, such that the ferroelectric capacitors are polarized. This represents one logic state. Another logic state can be obtained by changing the voltages so that the bit line 505 is at zero volts and the two plate lines 502 and 503 are plus five volts. Under such conditions the other logic state may be stored.

As understood by a person skilled in the art, the foregoing preferred embodiments of the present invention are illustrative of the present invention rather than limiting of the present invention. The present invention is intended to cover various modifications and similar arrangements included within the spirit and scope of the appended claims, the scope of which should be accorded the broadest interpretation so as to encompass all such modifications and similar structures.

What is claimed is:

1. A method for reading data from a non-volatile ferroelectric capacitor memory circuit having a plurality of word lines, a plurality of bit lines and a plurality of memory cells, each memory cell is constituted of a transistor, two ferroelectric capacitors having different polarization state therein connected in series which has a common node between said two ferroelectric capacitors and two terminals each corresponding uniquely to only one respective ferroelectric capacitor, wherein said common node is connected with a corresponding bit line through a channel of said transistor whose gate electrode is connected with a corresponding word line, comprising the steps of:

selecting a word line, biasing said word line to a voltage level, and then biasing the other word lines to an opposite voltage level to determine row address;

selecting a bit line to determine column address, and employing said selected word line and said selected bit line to determine a memory cell;

applying a reference voltage across two terminals in said determined memory cell, wherein said reference voltage does not change the original polarization state respectively stored in two ferroelectric capacitors in said determined memory cell; and sensing the voltage of said bit line to determine the polarization states of two ferroelectric capacitors in said determined memory cell.

2. The method according to claim 1, wherein the original polarization state of two ferroelectric capacitors are different.

3. The method according to claim 1, wherein said transistor is an N-type MOS transistor.

4. The method according to claim 1, wherein said transistor is a P-type MOS transistor.

\* \* \* \* \*